United States Patent [19]

Sweet

[11] Patent Number: 5,747,197
[45] Date of Patent: May 5, 1998

[54] METHOD OF PREPARING A PHOTOTOOL

[75] Inventor: Norman M. Sweet, Waterford, Mich.

[73] Assignee: Precision Coatings Inc., Walled Lake, Mich.

[21] Appl. No.: 724,189

[22] Filed: Oct. 1, 1996

[51] Int. Cl.$^6$ .................................................. G03F 9/00
[52] U.S. Cl. ........................ 430/5; 430/270.1; 430/332; 430/945
[58] Field of Search ................... 430/5, 270.1, 332, 430/945

[56] References Cited

U.S. PATENT DOCUMENTS

| | | | |
|---|---|---|---|
| 3,305,361 | 2/1967 | Gaynor et al. | 96/48 |
| 4,149,888 | 4/1979 | Loprest | 96/75 |
| 4,289,839 | 9/1981 | DiPippo | 430/177 |
| 4,373,020 | 2/1983 | Winslow | 430/339 |
| 4,788,129 | 11/1988 | Bouldin et al. | 430/273 |
| 5,187,049 | 2/1993 | Sher et al. | 430/340 |
| 5,223,376 | 6/1993 | Hasegawa et al. | 430/326 |
| 5,240,807 | 8/1993 | Jain et al. | 430/148 |
| 5,445,923 | 8/1995 | Takahashi et al. | 430/340 |
| 5,521,050 | 5/1996 | Henzel et al. | 430/269 |

*Primary Examiner*—Janet C. Baxter
*Assistant Examiner*—Rosemary Ashton
*Attorney, Agent, or Firm*—Gifford, Krass, Groh, Sprinkle, Patmore, Anderson & Citkowski,P.C.

[57] ABSTRACT

A photo mask or other phototool is directly prepared by the imagewise illumination of an azo dye with a high intensity source of illumination so as to cause the removal of the dye from the imaging medium. Illumination is preferably carried out with a laser light source having an output at a wavelength of less than 530 nanometers and an energy density of at least 100 mj per centimeter squared. Disclosed are some specifically preferred azo dyes.

18 Claims, No Drawings

METHOD OF PREPARING A PHOTOTOOL

FIELD OF THE INVENTION

This invention relates generally to photolithography. More specifically, the invention relates to a system and method for directly generating a photo mask or similar phototool from artwork or stored data without going through a silver based intermediate. Most specifically, the invention relates to a system and method for generating a phototool in which a laser is employed to directly address a diazo dye containing medium.

BACKGROUND OF THE INVENTION

Photolithographic and/or photoetch techniques are widely used in the fabrication of printed circuit boards, semiconductor devices, the preparation of printing plates, and a number of other such processes. Such photo techniques generally employ one or more masks, also referred to as phototools, which are often fabricated from a diazo based material.

Diazo photographic systems are based on the dye forming ability of various diazo compounds. These compounds, generally comprising a diazonium salt of an aromatic based nucleus, can undergo a chemical reaction with another molecular species, typically an aromatic compound referred to as a coupler, so as to form an azo dye compound. Such dyes typically have very high absorption coefficients, and by the appropriate choice of diazonium salt and coupler, various absorption spectra may be achieved. A variety of photographic systems which employ this basic reaction have been implemented. In some instances, light is used to initiate the coupling reaction, either by directly activating the reactants, or by unmasking a component of the system which undergoes further reaction. In other instances, light is employed to inactivate dye formation by inactivating one of the components of the system.

Diazo based dye systems have particular advantages in photolithography. The diazo system produces very high resolution allowing for preparation of finely detailed work. In addition, by appropriate choice of the imaging components, the absorption spectrum of the resultant azo dye can be optimized for particular applications. For example, some diazo dye compounds have very high optical absorptions in the near ultraviolet and violet portions of the spectrum, but have relatively low optical densities at longer wavelengths. A phototool prepared from such materials has particular advantage in a number of techniques, since the low absorption at visible wavelengths allows for the ready positioning and alignment of a phototool with underlying structures, while the high optical density in the short wavelength regions is particularly well suited for absorbing the short wavelength illumination generally favored in a number of photo techniques. Disadvantages of the diazo system primarily result from its lack of sensitivity. A typical diazo system operates at unit quantum efficiency or less. That is to say, one or more photons must be absorbed for each dye molecule which forms or bleaches.

Because of the relatively low photosensitivity of diazo films, a silver based intermediate film is often employed for transferring information from artwork, or electronically stored data to the diazo film. In such instances, the silver based film is employed to make an intermediate negative which is then utilized to expose the diazo film, typically by means of an intense light source such as a mercury lamp. It is desirable to avoid the use of the intermediate silver film. The film itself is relatively expensive, and its handling and processing steps further complicate the imaging process. In addition, some loss of resolution is inevitable any time that an additional imaging step is added to the process. Clearly, there would be great advantage to having a process by which a diazo based phototool could be directly fabricated from artwork or electronically stored data.

In accord with the present invention, there is provided a technique whereby a controllable light source, preferably a laser, is employed to directly address a diazo based film so as to generate a phototool therefrom. The system of the present invention provides high quality, high resolution diazo dye images in a rapid and economical manner. Also, the methodology of the present invention may be carried out under ambient lighting, thereby further simplifying the process.

The prior art has previously employed light sources, including lasers, to photobleach or ablate dye containing materials for various recording purposed; but, the prior art does not demonstrate any technology for directly fabricating a phototool, nor does the prior art show any methodology in accord with the present invention. Photobleaching of dyes, which in some instances include diazo dyes, is shown in U.S. Pat. Nos. 3,305,361 and 4,373,020. U.S. Pat. No. 4,788,129 discloses a laser writable film which includes a gelatin base having a layer of filamentary silver therein. The laser beam melts the silver causing it to agglomerate thereby lowering the optical density of the layer in an imagewise pattern. U.S. Pat. No. 5,223,376 discloses a photobleachable diazonium salt imaging system and U.S. Pat. No. 4,445,923 discloses a photobleachable imaging system which is laser addressable. None of these systems operate in the manner of the present invention, as will be described in greater detail hereinbelow.

BRIEF DESCRIPTION OF THE INVENTION

There is disclosed herein a method for generating a photo mask. The method includes the steps of providing an imaging medium having an azo dye therein; and illuminating the medium in an imagewise manner with a light having an intensity which is sufficient to remove at least a portion of the azo dye from the medium. Disclosed herein are some specific azo dye compounds having particular utility in the present invention. In certain embodiments, the azo dye is disposed in a polymeric matrix, which is supported upon a substrate. The step of illuminating the imaging medium may be carried out by means of a laser, and most preferably by utilizing wavelengths of less than 530 nanometers. In particular embodiments, the laser comprises an excimer laser having an output at a wavelength of less than 200 nanometers. The laser is preferably scanned across the imaging medium, either in a raster or vector mode. The laser is preferably operated in a pulsed mode so as to provide pulses having a length of no more than 100 nanoseconds, and more preferably the pulses have a length in the range of 15–20 nanoseconds. The laser preferably provides pulses having an intensity of at least 100 millijoules per $cm^2$.

DETAILED DESCRIPTION OF THE INVENTION

The present invention provides a method and an imaging material whereby diazo based phototooling may be directly fabricated from artwork or from data which is electronically stored in a computer. In accord with the invention, an imaging medium, comprising a film having an azo dye therein, is addressed in an imagewise manner, by scanning a high intensity beam of light thereacross. The beam of light is preferably provided by a laser, and the light removes some portion of the azo dye from the medium. By the appropriate choice of the azo dye, the intensity, and absorption spectrum of the medium may be selected. In the context of the present disclosure, the removal of the azo dye is understood to include any chemical or physical process which reduces the intensity of light absorption by the dye in a particular wavelength range of interest. Removal of the dye includes physical processes wherein the dye is ablated, evaporated or sublimed from the medium, as well as those processes in which the dye is degraded by the absorption of light so as to reduce its intensity.

The imaging medium employed in the present invention generally includes a substrate having the azo dye supported thereupon, and in this regard, the dye is typically disposed in a matrix material. The substrate is comprised of a material having dimensional stability and optical transparency sufficient to enable it to function as a portion of a phototool. Typical substrate materials comprise polymers such as polyethylene terepthalate (PET) films having a thickness in the range of 3–10 mils. In one particular embodiment, the substrate comprises seven mil thick PET. In other instances, the substrate may comprise a glass sheet, or a rigid body of polymeric material. The present invention is not limited to any particular substrate. In some instances, there may be a need to form an image on a metallic substrate, or on another opaque body, all of which are within the scope of the present invention.

While it is possible to incorporate the diazo dye directly into, or upon the substrate, the dye is preferably disposed in a polymeric matrix. The matrix may comprise any one of a number of polymers, and one particularly preferred matrix comprises cellulose acetate propionate (CAP). Other polymers such as cellulose acetate butyrate, as well as vinyl polymers may be similarly employed. Typically, the imaging layer has a thickness in the range of 0.1–1 mil, and in one particularly preferred embodiment the layer has a thickness of 0.3 mil.

The present invention may be practiced with a number of azo dye compounds. However, it has been found that certain unique dye compounds have particular advantages in the present invention insofar as they are readily ablatable, or otherwise removable by laser irradiation, and because they have absorption spectra which are particularly advantageous in the fabrication and use of phototooling.

As is known in the art, azo dyes can be formed by the coupling of a diazonium salt with another organic molecule, typically an aromatic molecule. One particular diazonium salt which may be employed to form azo dyes having utility in the present invention is represented by Formula I hereinbelow:

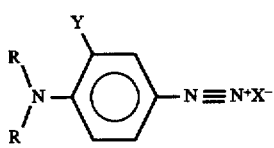

FORMULA I

Another diazonium salt having utility in the practice of the present invention is defined by Formula II hereinbelow:

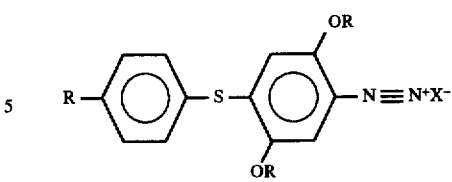

FORMULA II

In both instances, R equals hydrogen or an alkyl group, most preferably methyl, ethyl, or propyl; Y is a halogen, preferably chlorine or fluorine; and X may be any anion, and most typically comprises a halogen, $NO_3^-$, $HSO_4^-$, $BF_4^-$, $PF_6^-$, and the like.

The coupler molecule which reacts with the diazonium salt to form the diazo dye is preferably an aromatic molecule. Some particularly preferred couplers are represented by Formulas III and IV hereinbelow:

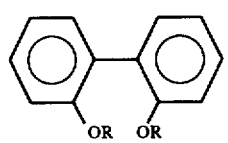

FORMULA III

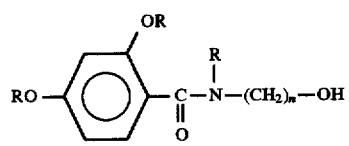

FORMULA IV

In the foregoing, R is hydrogen or alkyl as above, and for these particular couplers R is most preferably hydrogen or a low molecular weight alkyl; n is 0 or a whole number, and is most preferably 1, 2 or 3.

Azo dyes made in accord with the foregoing structural formulas are easily synthesized, stable on storage and readily ablated by light. Some particular dyes which may be utilized in the present invention will be described hereinbelow, but it is to be understood that such examples are illustrative of the present invention, and not limitations upon the practice thereof.

A first dye having utility in the present invention is prepared from a diazonium salt of the general Formula I herein above, in which the halogen, Y, is chlorine and both R groups are ethyl. The cation of this salt may be referred to as p-diazonium-o-chloro-N, N-diethylaniline. Reaction of this ion with a coupler of the general Formula III in which both R groups are hydrogen (2, 2'-dihydroxybiphenyl), couples the diazonium nitrogen to one of the aromatic rings to liberate HX and form the resultant azo dye. The resultant dye has a pale yellow color to the eye and a high absorption in the ultraviolet portions of the spectrum, typically below 360 nanometers.

If the coupling reaction is carried out with a coupler of the general Formula IV in which both R's are hydrogen and n is 2 (beta-resorcylic acid-ethanolamide), the resultant dye will have a brownish color to the eye, and will be primarily absorbing of light in the visible portions of the spectrum.

A similar group of compounds were prepared by reacting a diazonium salt of the type represented by Formula I in which both of the R groups are methyl, with the afore-described couplers. The resultant diazo dyes were generally similar to those obtained through the use of the diethyl compound.

Another group of diazo dyes were prepared from a diazonium salt of the type represented by Formula II, in which the R group para to the sulfur is methyl and the remaining R groups which are attached to the oxygens, are both ethyl. The corresponding cation may be referred to as 1-diazonium-2, 5-diethoxy-4-tolylmercapto-benzene. Coupling of this diazonium ion with either of the aforedescribed couplers produces an azo dye having a high absorption in the ultraviolet portions of the spectrum.

In the practice of the present invention, the azo dye may be formed in situ in the film, by a non-imagewise reaction. In this regard, diazo imaging films, of the type conventionally employed in photographic applications may be exposed in a non-imagewise manner, and developed so as to form a uniform layer of azo dye therein which may be subsequently employed in the practice of the present invention. In other instances, the imaging medium will contain both the diazonium salt and the coupler, in accord with the composition of conventional diazo films. The medium is then exposed to the laser in an imagewise manner, and the laser, through ablation, photochemical action or thermolysis, degrades one or more components of the azo dye. The medium is then developed, with or without prior non-imagewise flood exposure, depending on the polarity of the medium and of the final image. Within the context of this disclosure such removal of a component of the azo dye is considered to be a removal of the azo dye also.

More preferably, the azo dye is separately formed prior to incorporation into the imaging medium. In this manner, an imaging medium having a dye concentration, thickness and ancillary ingredients optimized for the practice of the present invention may be prepared. Reaction conditions for formation of azo dyes are well known to those of skill in the art, and a variety of reaction schemes may be readily implemented to form the dyes of the present invention. In general, coupling reactions utilizing phenolic based aromatic couplers are favored by mild alkaline conditions, while those involving aromatic amines are favored by mildly acidic conditions.

In the practice of the present invention, the sheet of imaging medium including the azo dye therein is illuminated in an imagewise manner with an intense light so as to cause the loss of azo dye therefrom in an imagewise pattern. Thus, a phototool is directly prepared. Illumination is preferably supplied by a high intensity source such as a laser, and in particular embodiments, the laser is scanned across a sheet of imaging material, while its output is being switched so as to produce the finished phototool. Scanning may take place in a raster manner wherein the beam is directed across the sheet of material in a series of parallel lines, while being switched on and off, to produce data points. Alternatively, the medium may be addressed by scanning a light beam thereacross in a vector graphic mode. This mode, also referred to in the art as a flying spot mode, sweeps a beam of light across a medium in a two dimensional pattern so as to draw out the elements of the phototool onto the medium. Generally, the vector or flying spot mode is preferred since it is quicker than the raster scan mode for most applications and generally provides higher resolution.

As noted above, the high intensity and rapid switching available from laser sources makes them most preferred for the practice of the present invention. The specific laser employed will depend upon the nature of the azo dye incorporated into the medium; however, it is generally preferred that any light source employed in the practice of the present invention have an output wavelength which is shorter than 530 nanometers. The shorter the wavelength the higher is the energy of the photons and the resolution. One particularly preferred group of light sources comprises excimer lasers. These lasers typically provide intense outputs in the ultraviolet portions of the spectrum. For example, an argon fluoride excimer laser provides an output of 193 nanometers, and is particularly suited for the present invention. Similarly, other noble gas/halogen laser systems such as XeF; ArCl; XeCl and the like may be employed.

A number of other lasers are commercially available which are highly efficient and have intense outputs in longer wavelength regions of the spectrum. Such lasers may have their outputs frequency multiplied, through the use of doubler and tripler crystals as is known in the art, so as to produce shorter wavelength beams. For example, a NdYLF laser has an output at 1047 nanometers, a portion of the spectrum at which most azo dyes are transparent. This output may be frequency doubled to 532 nanometers, frequency tripled to 349 nanometers and frequency quadrupled to 262 nanometers, all of which wavelengths may be employed in the practice of the present invention.

The intensity of the laser imaging light must be sufficient to ablate or otherwise remove the azo dye from the phototool. The exact energy intensity needed will depend upon the wavelength employed and the specific absorption of the particular dye; however, for most azo dyes of the present invention a fluence level of at least 5.7 mj per square millimeter will be required at a wavelength of 532 nm.

As mentioned above, an ArF excimer laser having an output of 193 nanometers is one preferred light source employed in the present invention. It has been found that an imaging medium is prepared from an azo dye prepared in accord with the first example above, and incorporated in a CAT medium approximately 6 microns thick, and at a concentration of approximately 3–5 mg per square centimeter, total clearing of the dye from the medium is accomplished by illuminating the medium with approximately 15–20 pulses, each pulse having a duration of 15 to 20 nanoseconds and an energy intensity of 160 mg, per centimeter squared. The image thus produced is stable to ambient conditions and may be readily employed as a phototool.

Similar results will be obtained utilizing the other excimer lasers described herein above as well as with frequency multiplied YAG or $CO_2$ lasers.

In accord with the present invention, a device for measuring and/or calibrating the output of a laser, of the type employed in the practice of the aforedescribed imaging process, may be fabricated. The calibration device comprises a substrate having a relatively thick coating of the aforedescribed type thereupon. The coating may comprise a loading of 10–100 mg of the azo dye per centimeter squared. The coating may be in the form of a plurality of superposed, thin layers, or it may comprise a single relatively thick layer. In use, the calibration device will be disposed so as to be illuminated by the laser, and the extent to which the color of the azo dye is reduced will be directly proportioned to the energy output of the laser.

It will be appreciated from the foregoing that the present invention provides for a method and imaging medium which allows for the rapid, accurate and economical preparation of phototooling by directly writing upon an imaging material with a high intensity source of light. The source of light may be readily controlled by conventional scanning optics in response to a direct input of stored digital data, so as to allow the system to directly interface with computer graphic hardware. Alternatively, the system may be coupled to an optical scanner which scans and digitizes artwork, and uses the resultant digital signal to control the light source. The foregoing discussion, description and examples are illustrative of particular embodiments of the present invention, and are not meant to be limitations upon the practice thereof. In view thereof, numerous modifications and variations of the invention will be readily apparent to those of skill in the art, and it is the following claims, including all equivalents which define the scope of the invention.

I claim:

1. A method of generating a photo mask, said method including the steps of:
   providing a sheet of an imaging medium, said medium including an azo dye therein, said dye being formed by the reaction of an aromatic coupling agent with a diazonium salt selected from the group consisting of:

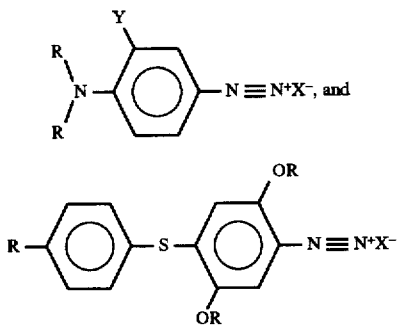

wherein R is hydrogen or an alkyl, Y is a halogen and X is an anion; and illuminating said imaging medium in an imagewise manner with a light having a wavelength of no more than 532 nm and an intensity which is sufficient to remove at least a portion of said azo dye from said medium.

2. A method as in claim 1, wherein said aromatic coupler is a phenol.

3. A method as in claim 1, wherein said aromatic coupler is an aromatic amine.

4. A method of claim 1, wherein said aromatic compound is selected from the group consisting of:

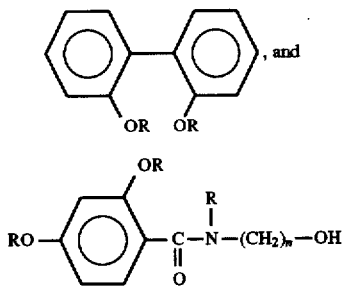

wherein R is hydrogen or an alkyl and n is 0 or a positive integer.

5. A method as in claim 1, wherein said medium includes an azo dye which is disposed in a polymeric matrix.

6. A method as in claim 5, wherein said polymeric matrix is selected from the group consisting of:
   cellulose acetate propionate, cellulose acetate butyrate, vinyl polymers, and combinations thereof.

7. A method as in claim 1, wherein the step of illuminating said imaging medium comprises illuminating said medium with a laser having an output wavelength of less than 530 nm.

8. A method as in claim 7, wherein said laser is an excimer laser having an output at a wavelength of less than 200 nm.

9. A method as in claim 8, wherein said laser is an ArF excimer laser having an output at approximately 193 nm.

10. A method as in claim 1, wherein the step of illuminating said imaging medium comprises scanning a laser beam across said medium.

11. A method as in claim 10, wherein the step of scanning said laser beam comprises scanning said beam in a raster mode.

12. A method as in claim 10, wherein the step of scanning said laser beam comprises scanning said laser beam in a vector mode.

13. A method as in claim 1, wherein the step of illuminating said imaging medium comprises illuminating said medium with pulsed laser beam.

14. A method as in claim 13, wherein said pulsed laser beam has an energy density of at least 100 mj/cm$^2$ per pulse.

15. A method as in claim 13, wherein the pulse length of said pulsed laser beam is no more than 100 ns.

16. A method as in claim 13, wherein the pulse length of said pulsed laser beam is in the range of 15–20 ns.

17. A method as in claim 1, wherein the step of illuminating said imaging medium comprises illuminating said medium with a laser beam from a frequency multiplied laser, said frequency multiplied beam having a wavelength of less than 530 nm.

18. A method of generating a photo mask, said method including the steps of:
   providing a sheet of an imaging medium, said medium comprising a matrix having an azo dye disposed therein, said azo dye comprising the product of a coupling reaction between a diazonium salt of the type selected from the group consisting of:

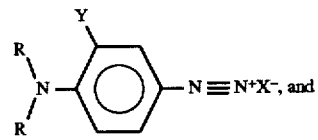

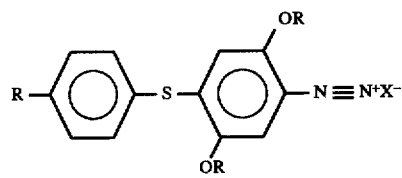

wherein R equals hydrogen or alkyl, Y equals halogen and X is an anion, and a coupling reagent selected from the group consisting of:

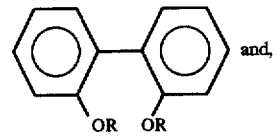

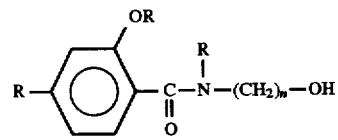

where R equals hydrogen or an alkyl and n equals 0 or a positive integer; and illuminating said imaging medium, in an image wise manner with light from a laser light source an output at wavelength of less than 530 nanometers and an energy density of at least 100 mj/cm$^2$.

* * * * *

UNITED STATES PATENT AND TRADEMARK OFFICE

CERTIFICATE OF CORRECTION

PATENT NO.    : 5,747,197
DATED         : May 12, 1998
INVENTOR(S)   : JOLLY

It is certified that error appears in the above-identified patent and that said letters patent is hereby corrected as shown below:

Title page, left-hand column, delete [73] Assignee: Reddie & Grose, Hampshire, United Kingdom" and replace by --Flameguard Insulations, Hampshire, United Kingdom--.

Signed and Sealed this

Twelfth Day of October, 1999

*Attest:*

Q. TODD DICKINSON

*Attesting Officer*    *Acting Commissioner of Patents and Trademarks*